United States Patent
Guo

(10) Patent No.: US 10,892,876 B2
(45) Date of Patent: Jan. 12, 2021

(54) METHODS AND APPARATUS FOR DYNAMIC ACKNOWLEDGEMENT LIST SELECTION IN DETECTION OF UPLINK CONTROL CHANNEL FORMATS

(71) Applicant: Cavium, LLC, Santa Clara, CA (US)

(72) Inventor: Yuanbin Guo, Mountain House, CA (US)

(73) Assignee: Cavium, LLC, Santa Clara, CA (US)

( * ) Notice: Subject to any disclaimer, the term of this patent is extended or adjusted under 35 U.S.C. 154(b) by 98 days.

(21) Appl. No.: 16/148,796

(22) Filed: Oct. 1, 2018

(65) Prior Publication Data

US 2019/0334685 A1    Oct. 31, 2019

Related U.S. Application Data

(60) Provisional application No. 62/663,887, filed on Apr. 27, 2018.

(51) Int. Cl.
*H04J 3/00* (2006.01)
*H04L 5/00* (2006.01)
(Continued)

(52) U.S. Cl.
CPC ........ *H04L 5/0057* (2013.01); *H03M 13/136* (2013.01); *H04L 5/0055* (2013.01);
(Continued)

(58) Field of Classification Search
CPC ....... H04L 5/0057; H04L 5/0055; H04L 1/00; H03M 13/136; H04W 72/0446; H04W 72/085; H04W 72/0413
See application file for complete search history.

(56) References Cited

U.S. PATENT DOCUMENTS

| 2010/0124291 A1* | 5/2010 | Muharemovic | H04L 27/28 375/260 |
| 2011/0080876 A1* | 4/2011 | Yin | H03M 13/6525 370/329 |

(Continued)

OTHER PUBLICATIONS

"3GPP Technical Specification 36.211", 2013, V10.7.0, Valbonne, France, www.3gpp.org.
(Continued)

*Primary Examiner* — Maharishi V Khirodhar
(74) *Attorney, Agent, or Firm* — JW Law Group; James M. Wu

(57) ABSTRACT

Methods and apparatus for dynamic acknowledgement list selection in detection of uplink control channel formats. In an exemplary embodiment, an apparatus includes a dynamic acknowledgement (ACK) list allocation circuit that generates a dynamic ACK list that includes one or two most likely ACK candidates, and a top-Q candidate CQI bits detector that dynamically allocates a detection branch to each of the one or two most likely ACK candidates to detect top-Q candidate CQI bits. The apparatus also includes a merger circuit that mergers the top-Q candidate CQI bits detected for the one or two most likely ACK candidates to generate a merged list, a top-Q CQI symbol generator that generates top-Q CQI symbols for the top-Q candidate CQI bits detected for the one or two most likely ACK candidates, and a joint detector that detects transmitted CQI bits and ACK bits.

20 Claims, 7 Drawing Sheets

(51) Int. Cl.
  *H03M 13/13* (2006.01)
  *H04W 72/04* (2009.01)
  *H04W 72/08* (2009.01)

(52) U.S. Cl.
  CPC ... *H04W 72/0413* (2013.01); *H04W 72/0446* (2013.01); *H04W 72/085* (2013.01)

(56) References Cited

U.S. PATENT DOCUMENTS

| | | | | |
|---|---|---|---|---|
| 2012/0088533 A1* | 4/2012 | Khoshnevis | .......... | H04L 1/0027 455/509 |
| 2013/0208672 A1* | 8/2013 | Papasakellariou | .... | H04L 1/0028 370/329 |
| 2015/0110050 A1* | 4/2015 | Guo | ...................... | H04L 5/0057 370/329 |

OTHER PUBLICATIONS

D. Wang, S. Yang, Y. Liao, Y. Liu, "Efficient Receiver Scheme for LTE PUCCH" in IEEE Communications Letter, Mar. 2012, vol. 16 No. 3.

Y. Wu, D. Danev, E. G. Larsson, "On ACK/NACK Messages Detection in the LTE PUCCH with Multiple Receive Antennas" in 20th European Signal Processing Conference, Aug. 27-31, 2012, Bucharest, Romania.

* cited by examiner

METHODS AND APPARATUS FOR DYNAMIC ACKNOWLEDGEMENT LIST SELECTION IN DETECTION OF UPLINK CONTROL CHANNEL FORMATS

CLAIM TO PRIORITY

This application claims the benefit of priority based upon U.S. Provisional Patent Application having Application No. 62/663,887, filed on Apr. 27, 2018, and entitled "METHOD AND APPARATUS FOR DYNAMIC ACK LIST SELECTION IN DETECTION OF UPLINK CONTROL CHANNEL FORMAT 2A AND 2B IN LTE" which is hereby incorporated herein by reference in its entirety.

FIELD

The exemplary embodiments of the present invention relate to telecommunications networks. More specifically, the exemplary embodiments of the present invention relate to receiving and processing data streams via a wireless communication network.

BACKGROUND

There is a rapidly growing trend toward mobile and remote data access over high-speed communication networks, such as provided by 3G or 4G cellular services. For example, using these services, users now rely on their smartphones for texting, access to email, banking, and social media, and for sending and receiving pictures and video.

Typically, wireless network performance depends in part on the quality of the transmission channel. For example, if the channel conditions are good, the network may perform with higher speed and capacity than when the channel conditions are poor. To obtain the best network performance, wireless networks may rely on user devices (e.g., user equipment "UE") to report control information back to the network. The control information includes parameters indicating the channel conditions and/or transmission parameters. One mechanism available to user devices to report control information back to the network is through a dedicated physical uplink control channel (PUCCH). The network receives the control information over this channel and uses the received parameters to adjust data transmissions for optimum performance based on the network conditions indicated by the received parameters.

The PUCCH carries important control information, including Channel Quality Indicator (CQI) and Hybrid Automatic Repeat Request Acknowledge (HARQ-ACK) information. The PUCCH may be formatted in several ways to communicate the control information, such as format 1, format 2x (format 2, 2a, 2b) and formats 3, 4, 5, etc. These formats identify how the control information is encoded and/or modulated in the PUCCH.

The performance of ACK messages play an important role in the overall downlink performance as the residual error rate of HARQ is in the same order of the feedback error rate of the ACK bits. The CQI information represents the recommended modulation scheme and coding rate to be used for downlink transmissions. Its accuracy greatly impacts the overall system throughput that can be achieved in a noisy channel. Thus, improving the error performance of both CQI and ACK detection is desirable to the achieve improved network throughput Therefore, it is desirable to have a detection mechanism that efficiently detects with high probability, control bit information transmitted from a UE over a PUCCH.

SUMMARY

In various exemplary embodiments, methods and apparatus are provided for dynamic acknowledgement list selection in detection of uplink control channel formats. For example, the dynamic ACK list selection reduces the complexity of channel estimation and ACK/CQI detection dynamically. In an exemplary embodiment, a dynamic ACK-list allocation circuit searches the most likely ACK candidates from a subspace search via some coarse level metric to select one or both of Max_ACK and subMax_ACK candidates. These candidates are used to determine the transmitted ACK and CQI bits in a process that reduces the complexity and resources typically used in conventional systems.

In an exemplary embodiment, an apparatus is provided that includes a dynamic acknowledgement (ACK) list allocation circuit that generates a dynamic ACK list that includes one or two most likely ACK candidates, and a top-Q candidate CQI bits detector that dynamically allocates a detection branch to each of the one or two most likely ACK candidates to detect top-Q candidate CQI bits. The apparatus also includes a merger circuit that mergers the top-Q candidate CQI bits detected for the one or two most likely ACK candidates to generate a merged list, a top-Q CQI symbol generator that generates top-Q CQI symbols for the top-Q candidate CQI bits detected for the one or two most likely ACK candidates, and a joint detector that detects transmitted CQI bits and ACK bits.

In an exemplary embodiment, a method is provided that includes the operations of searching ACK candidates to generate a dynamic ACK list that includes one or two most likely ACK candidates, and dynamically allocating a detection branch to each of the one or two most likely ACK candidates in the dynamic ACK list. The detection branches detect top-Q candidate CQI bits for the one or two most likely ACK candidates in the dynamic ACK list. The method also includes the operations of merging the top-Q candidate CQI bits detected for the one or two most likely ACK candidates in the dynamic ACK list to generate a merged list, generating top-Q CQI symbols for the top-Q candidate CQI bits detected for the one or two most likely ACK candidates in the dynamic ACK list, and detecting transmitted CQI bits and ACK bits from metrics determined from the top-Q CQI symbols.

Additional features and benefits of the exemplary embodiments of the present invention will become apparent from the detailed description, figures and claims set forth below.

BRIEF DESCRIPTION OF THE DRAWINGS

The exemplary aspects of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
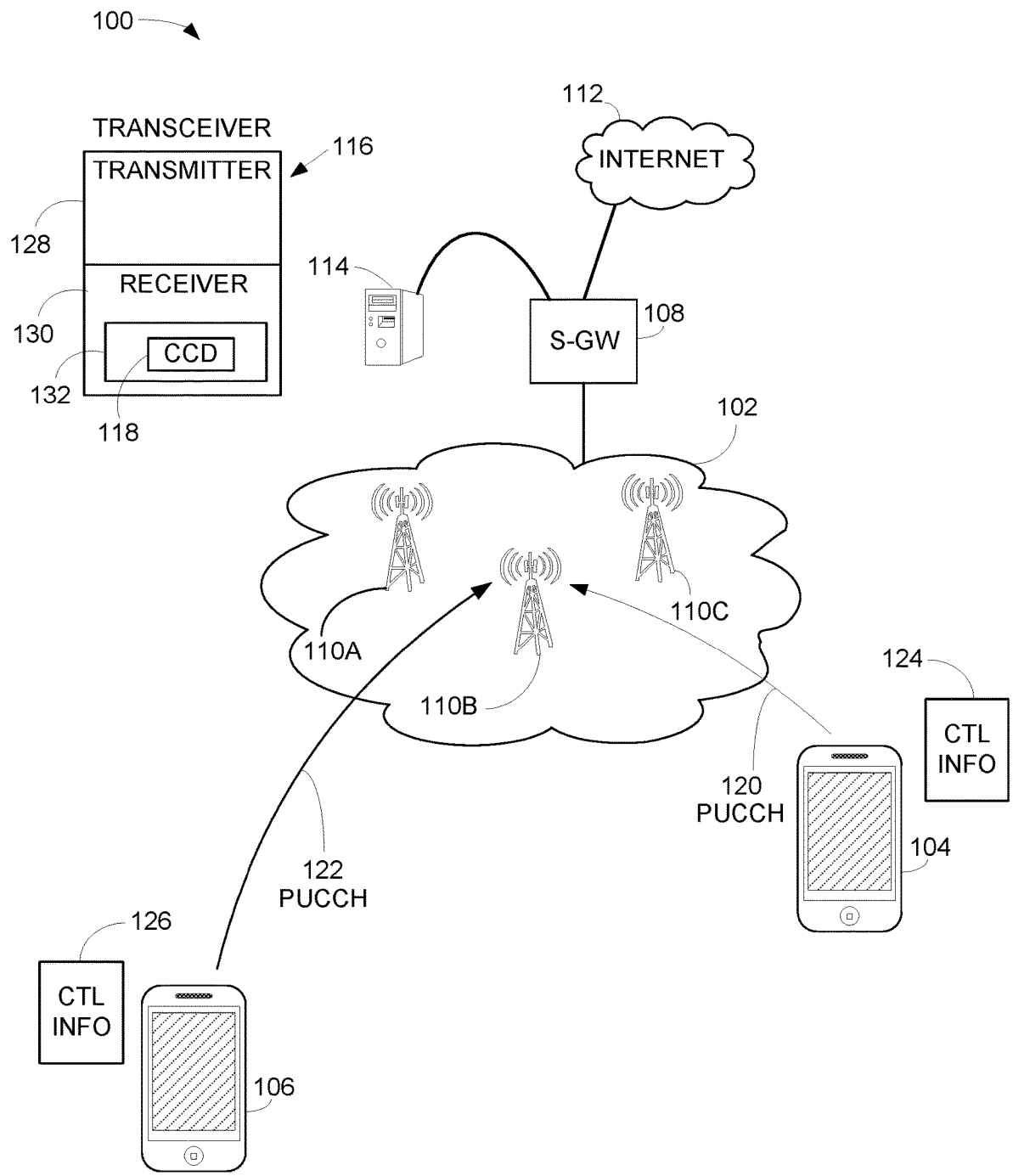
FIG. 1 shows a communication network comprising a transceiver having an exemplary embodiment of a control channel detector (CCD) that efficiently receives and detects control bit information transmitted from user equipment over a dedicated PUCCH.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application and/or other constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiments of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

FIG. 1 shows a communication network 100 comprising a transceiver 116 having an exemplary embodiment of a control channel detector (CCD) 118 that efficiently receives and detects control bit information transmitted from user equipment over a dedicated PUCCH. The network 100 may also be referred to as a third generation (3G), fourth generation (4G), long term evolution (LTE), or combination of 3G and 4G cellular network configuration.

The communication network 100 includes a server 114 that includes the transceiver 116. The transceiver 116 has a transmitter portion 128 and a receiver portion 130. The server 114 communicates with a serving gateway (S-GW) 108 that further communicates with cell site 102 and the Internet 112. The cell site 102 includes radio towers 110A-C and associated base stations (not shown).

User equipment (UE) 104 and user equipment 106 are in communication with base station 110B. For example, the UEs 104, 106 can be cellular phones, handheld devices, tablet computers or iPad® devices. It should be noted that the underlying concepts of the exemplary embodiments of the present invention would not change if one or more blocks (or devices) were added or removed from the communication network 100.

In an exemplary embodiment, the UE 104 transmits control bit information 124 to the server 114 using PUCCH 120 and the UE 106 transmits control bit information 126 to the server 114 using PUCCH 122. In an exemplary embodiment, the control bit information includes CQI bits and HARQ-ACK bits.

The receiver portion 130 includes receiver processing hardware (RPH) 132. In an exemplary embodiment, the RPH 132 includes the CCD 118, which is used to perform efficient detection of the control information received over PUCCH from the user equipment. In various exemplary embodiments, the CCD 118 is able to detect the control bit information from received subframes with higher probability than conventional systems to enhance the overall efficiency of the receiver and the operation of the communication network 100.

In an exemplary embodiment, the PUCCH is formatted in a selected format. For example, format 2x encodes and modulates the CQI/ACKs in three different ways, namely, format 2, format 2a, and format 2b. For example, the CQI/ACK are modulated based on the number of information bits, as shown in the Table 1 below.

TABLE 1

| PUCCH format | Modulation scheme | Number of coded bits per subframe, $M_{bit}$ | Normal CP | Extended CP |
| --- | --- | --- | --- | --- |
| 2 | QPSK | 20 | CQI | CQI or HARQ-ACK + CQI |
| 2a | QPSK + BPSK | 21 | CQI + 1x HARQ-ACK | — |
| 2b | QPSK + QPSK | 22 | CQI + 2x HARQ-ACK | — |

The CQI codewords are coded using a (20, A) block code and are a linear combination of 13 basis sequences denoted by $M_{i,n}$ as defined by the following equation.

$$b_i = \Sigma_{n=0}^{A-1}(a_n \cdot M_{i,n}) \bmod 2,$$

where i=0, 1, 2, . . . , B−1, and in the basis sequence $M_{i,n}$ for the (20, A) block code, A is the length of the un-coded information bits, which range from 4 to 13. B is the length of the coded bits, which in this case is 20 as illustrated in exemplary Table 2 below.

TABLE 2

| Basis sequences for (20, A) code. | | | | | | | | | | | | | |
| --- | --- | --- | --- | --- | --- | --- | --- | --- | --- | --- | --- | --- | --- |
| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |

TABLE 2-continued

Basis sequences for (20, A) code.

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 0 | 1 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 0 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

Figure 2:
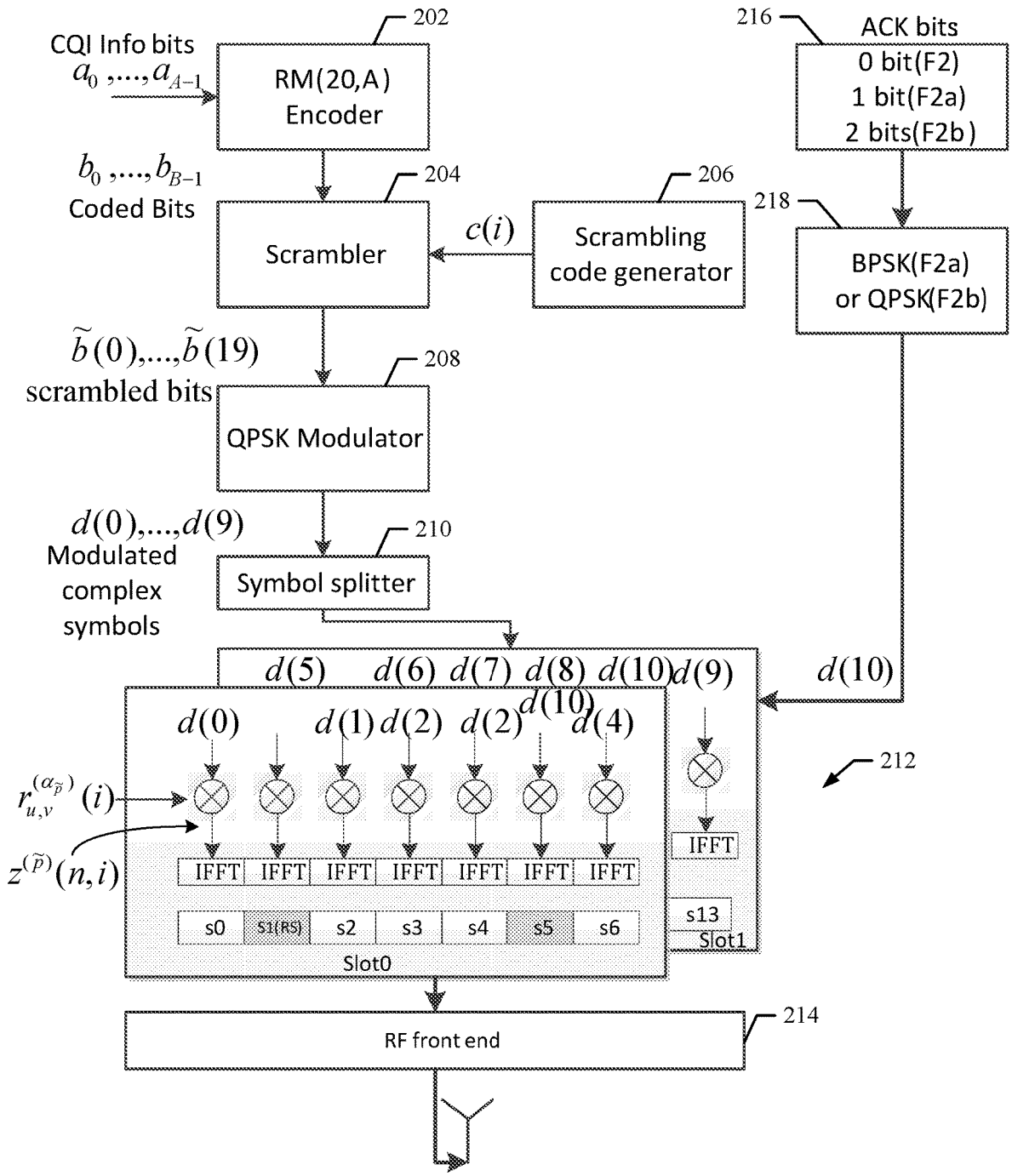
FIG. 2 is a block diagram illustrating a transmission model for PUCCH formats 2/2a/2b in accordance with embodiments of the present invention.

FIG. 2 is a block diagram illustrating a transmission model for PUCCH format 2/2a/2b in accordance with embodiments of the present invention. In the transmission model, the information CQI bits $a_0, \ldots, a_{A-1}$ are passed to a Reed-Muller (RM) (20, A) encoder 202 to generate (in this case) 20 coded bits $b(0), \ldots, b(19)$. The block of coded bits $b(0), \ldots, b(19)$ is input to a scrambler 204 that scrambles the bits with a user equipment (UE)-specific scrambling sequence (c(i)), provided by the scrambling code generator 206, resulting in a block of scrambled bits $\tilde{b}(0), \ldots, \tilde{b}(19)$ according to: $\tilde{b}(i)=(b(i)+c(i))\bmod 2$, where the scrambling sequence c(i) is given by industry standard specifications. The scrambling sequence generator 206 shall be initialized with $c_{init}=(\lfloor n_s/2 \rfloor+1)\cdot(2N_{ID}^{cell}+1)\cdot 2^{16}+n_{RNTI}$ at the start of each subframe where $n_{RNTI}$ is C-RNTI given by industry standard specifications.

The block of scrambled bits $\tilde{b}(0), \ldots, \tilde{b}(19)$ are input to a QPSK modulator 208 to be QPSK modulated, resulting in a block of complex-valued modulation symbols $d(0), \ldots, d(9)$ that are passed through symbol splitter 210 and thereafter input to OFDM symbol generators 212. Each of the complex-valued symbols $d(0), \ldots, d(9)$ is multiplied with a cyclically shifted length $N_{seq}^{PUCCH}=12$ sequence $r_{u,v}^{(\tilde{\alpha}_p)}(n)$ for each of the P antenna ports used for PUCCH transmission according to:

$$z^{(\tilde{p})}(N_{seq}^{PUCCH} \cdot n + i) = \frac{1}{\sqrt{P}} d(n) \cdot r_{u,v}^{(\alpha_p)}(i)$$

$$n = 0, 1, \ldots, 9$$

$$i = 0, 1, \ldots, N_{sc}^{RB} - 1$$

where $r_{u,v}^{(\alpha_{\tilde{p}})}(i)$ is defined by industry specifications with $M_{sc}^{RS}=N_{seq}^{PUCCH}$.

The $z^{(\tilde{p})}(n,i)$ sequences will be passed to IFFT circuits to generate the SC-FDMA signal for each of the OFDM symbols in two slots of a subframe excluding the two reference symbols in s1 and s5 and then sent to the RF front-end 214 for transmission over the antennas.

For PUCCH formats 2a and 2b, indicated at 216 and supported for normal cyclic prefix only, the bit(s) $b(20), \ldots, b(M_{bit}-1)$ shall be modulated by either BPSK or QPSK at block 218, respectively, resulting in a single modulation symbol $d(10)$ used in the generation of the reference-signal for PUCCH format 2a and 2b. The $d(10)$ symbol will be put in the second RS symbol location at both slots. The two slots will be mapped to the physical resource according to industry standards and then sent to the RF front-end 214 for transmission over the antennas.

Figure 3:
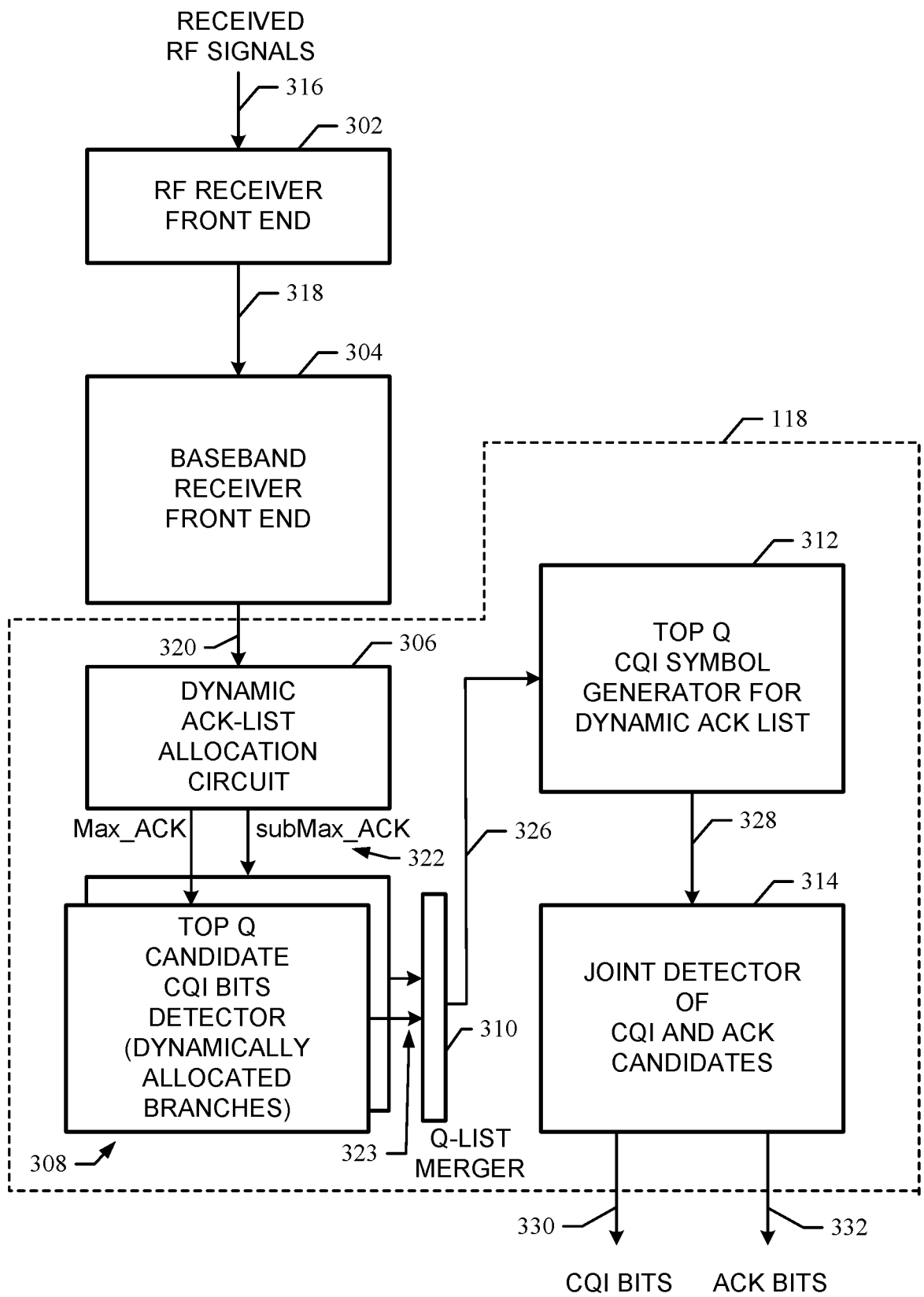
FIG. 3 shows an exemplary embodiment of the control channel detector shown in FIG. 1.

FIG. 3 shows an exemplary embodiment of the control channel detector 118 shown in FIG. 1. For example, the control channel detector 118 operates to receive control bit information contained in received subframes and to determine the transmitted CQI and ACK bits.

During operation, received RF signals 316 are received at an RF front end 302. The received RF signals 316 comprise information transmitted in a PUCCH. The front end passes the received signals 318 to a baseband receiver front end 304. For example, the baseband receiver front end 304 is part of the receiver 130 shown in FIG. 1. The baseband receiver front end 304 processes the received RF signals 318 to generate baseband signals 320.

A dynamic ACK-list allocation circuit 306 receives the baseband signals 320 output from the baseband receiver front end 304. The dynamic ACK-list allocation circuit 306 operates to detect Max_ACK, and if necessary, sub_Max-ACK candidates 322 that are pass to one or more branches of a top "Q" CQI candidates CQI bits detector 308, where Q is a selected number of candidates. The number of branches used is dynamically allocated based on whether one or both of the Max_ACK and sub_MaxACK candidates 322 are detected. The dynamic ACK-list allocation circuit 306 results in less branches of the detector 308 being dynamically allocated, which reduces the complexity of the channel estimation and ACK/CQI detection dynamically. Simulation shows that typical complexity reduction can be 1.2~1.5 times that of the single branch without noticeable performance impact. This is equivalent to 2.8-2.6 times reduction compared with the traditional search of all 4 ACK hypothesis for the case of format 2b.

The Top-Q candidates 323 are output to a Q-list merger 310 that merges the detected bits to generate merged bits 326. The merged bits 326 are passed to a Top-Q CQI symbol generator 312. The symbol generator 312 generates symbols 328 for each of the Top-Q CQI candidates. The generated symbols 328 are input to the joint detector 314. If the PUCCH format is 2a or 2b, the detector 314 will generate symbols for all possible ACK candidates. Energy metrics for the CQI candidate symbols, ACK candidate symbols, and the pilot symbols are combined into a search space that is searched to determine the most likely CQI 330 and ACK 332 bits.

Thus, the CCD 118 operates to generate a plurality of CQI candidates and converts these candidates into symbols. Likewise, if format 2a or 2b is used, ACK candidate symbols also are generated. Energy metrics from the symbols are combined into a search space that is searched to determine the final CQI and ACK bits. A detailed description of the CCD 118 is provided below.

Figure 4:
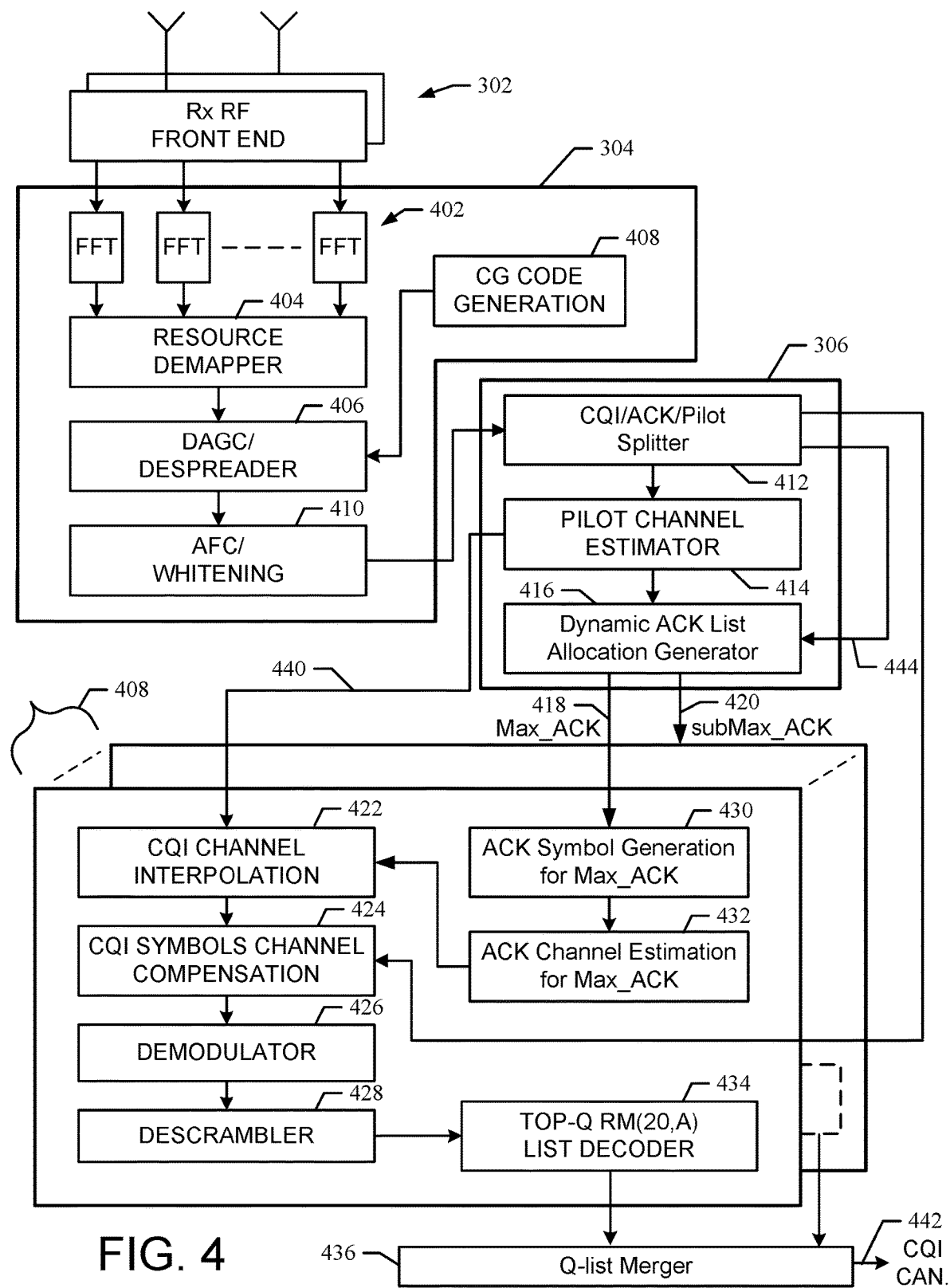
FIG. 4 shows a block diagram illustrating a receiver that includes an exemplary embodiment of a dynamic ACK-list allocation circuit that reduces the complexity of channel estimation and ACK/CQI detection dynamically.

FIG. 4 shows a block diagram illustrating a receiver that includes an exemplary embodiment of a dynamic ACK-list allocation circuit 306 that reduces the complexity of channel estimation and ACK/CQI detection. Simulation shows that typical complexity reduction can be 1.2~1.5 times that of a single branch without noticeable performance impact. This is equivalent to a 2.8~2.6 times reduction compared with the traditional search of all 4 ACK hypotheses for the case of format 2b.

In traditional RM decoder-based detection of ACK/CQI bits, 2^Nack identical detection module branches are used to search all possible ACK symbol candidates. By comparing all the 2/4 possible ACK candidates for Format 2a/2b, respectively, the final estimate for both CQI/ACK bits is obtained.

In an exemplary embodiment, the dynamic ACK-list allocation circuit 306 selects one or two ACK hypotheses instead of performing a fixed search of all ACK hypothesis as in traditional methods. Thus, only the most likely ACK candidates are applied in the subsequent channel estimation and RM decoding for the CQI bits, which results in faster operation and uses less processing resources than traditional methods.

In an exemplary embodiment, the baseband front end 304 comprises FFT processors 402, a resource demapper 404, a digital AGC (DAGC)/despreader 406, a CG code generator 408 and an AFC/whiting processor 410. During operation, received RF signals comprising a PUCCH are received at the RF front end 302. The RF front end 302 passes the received signals to the FFT processors 402 of the baseband front end 304. The FFT processors 402 convert time domain signals to the frequency domain and output the frequency domain signals to the resource demapper 404. The resource demapper 404 collects the PUCCH signals from the corresponding resource locations. Next, digital AGC (DAGC) is followed by a CG code despreader 406 that uses a CG code generated by a local CG code generator 408 to perform gain control and a despreading operation. To overcome noisy channel condition, some Automatic Frequency Control (AFC) or whitening algorithms 410 may be applied to compensate the frequency offset and equalize the channel. The signals after the channel whitening are fed into the dynamic ACK-list allocation circuit 306.

The dynamic ACK-list allocation circuit 306 operates to select the most likely ACK candidates for subsequent processing. The allocation circuit 306 comprises a CQI/ACK/Pilot splitter 412, pilot channel estimator 414, and dynamic ACK-list allocation generator 416. During operation, the signals received from the baseband front end 304 are input to the splitter 412, which split off CQI, ACK, and Pilot symbols for downstream processing. The pilot information is input to the pilot channel estimator 414 that estimates the pilot channel and inputs this information to the generator 416. The generator 416 also receives CQI and ACK information from the splitter 412. The generator 416 uses the information it receives to select the most likely ACK candidates for downstream processing. In an exemplary embodiment, the generator 416 determines and outputs a first most likely ACK candidate (Max_ACK) 418 and possibly a second most likely ACK candidate (subMax_ACK) 420.

Figure 5:
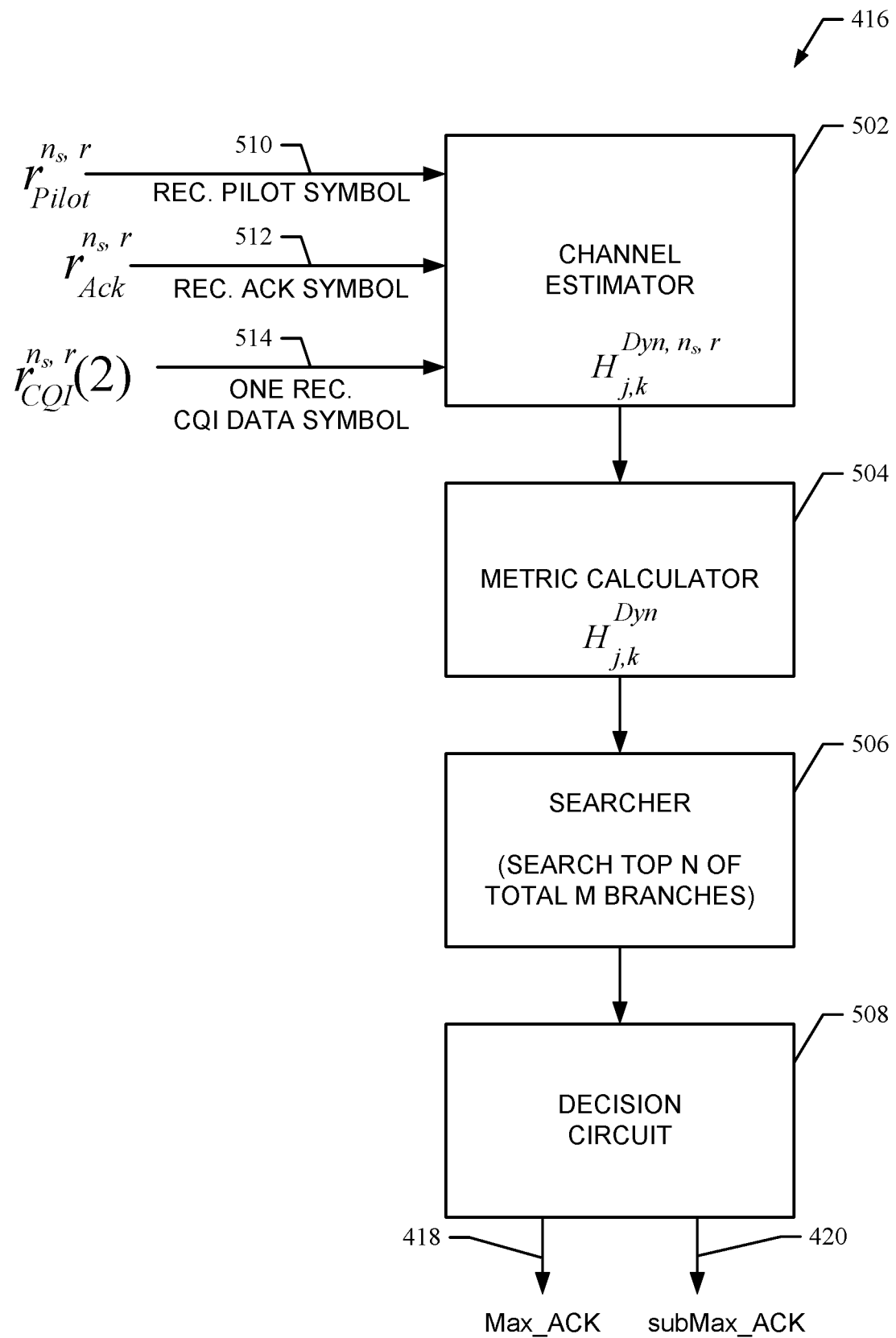
FIG. 5 shows an exemplary embodiment of a dynamic ACK-list allocation generator shown in FIG. 4.

FIG. 5 shows an exemplary embodiment of the dynamic ACK-list allocation generator 416 shown in FIG. 4. In an exemplary embodiment, the dynamic ACK-list allocation generator 416 comprises a channel estimator 502, metric calculator 504, searcher 506, and decision circuit 508.

In an exemplary embodiment, the dynamic ACK-list allocation generator 416 performs ACK branch selection using a majority logic decision process. In an exemplary embodiment, an initial dynamic ACK list selection or allocation module that searches the most likely ACK candidates from a subspace search using some coarse level metric. Instead of using all possible ACK hypothesis symbols {1+j, 1−j, −1+j, −1−j} as the DMRS symbols for the channel estimation, the dynamic ACK selector will calculate some metric based for all possible ACK symbols and select only the Max_ACK and subMax_ACK candidates.

One exemplary metric will use the 2 or 4 ACK hypothesis symbols together with another selected data symbol, such d(2) to form a symbol-level tree search and calculate the channel energy of all the possible channel energy, where d(2) can have four possible transmitted symbols denoted as $d(2)_k$, $k \in \{0, 1, 2, 3\}$. In an exemplary embodiment, the channel estimator 502 receives pilot symbol 510, a received ACK symbol 512 and one received CQI data symbol 514 (symbols 512 and 514 shown as 444 in FIG. 4) and estimates the channel as calculated from the following expression.

$H_{j,k}^{Dyn,ns,r} = r_{pilot}^{ns,r} + r_{Ack}^{ns,r} \cdot (s_{Ack}^j)^* + r_{CQI}^{ns,r}(2) \cdot [d(2)_k]^*$ From the above, the metric calculator 504 calculates a channel energy metric from the following.

$$H_{j,k}^{Dyn} = \sum_{r} \sum_{n_s=0}^{1} (H_{j,k}^{Dyn})(H_{j,k}^{Dyn})^*$$

$(j, k)_{Top4} = \arg\max_{j,k} T4(H_{j,k}^{Dyn}) \in \{(j_0, k_0), (j_1, k_1), (j_2, k_2), (j_3, k_3)\}$ From the above, the searcher 506 keeps the top four branches out of the 16 tree nodes for next level selection.

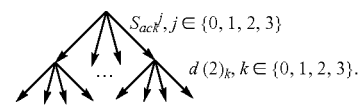

$S_{ack}^j, j \in \{0, 1, 2, 3\}$
$d(2)_k, k \in \{0, 1, 2, 3\}$.

The top 4 nodes of the tree search can have four different ACK candidates, or less than four ACK candidates depending on the accuracy of the detection. If the channel condition is good, it can be expected that the ACK detection based on the three data symbols will lead to accurate ACK candidates, making ACK bits of the four top nodes identical or most of the four candidates having the same ACK hypothesis. From the top four nodes from the tree search, only the top two different ACK branches will be used for the downstream channel estimation and RM decoding for the CQI detection.

In an exemplary embodiment, the decision circuit 508 performs an exemplary allocation strategy based on a majority logic decision, although other decision logic or strategies can be utilized. For a majority logic decision, if there are three identical ACK candidates in the top 4 symbol list, then it is most likely that the Max_ACK is accurate and thus only the Max_ACK branch is used. On the hand, if there are less than 3 identical ACK candidates, then two ACK candidates are kept, namely; the Max_ACK and the subMax_ACK. The subMax_ACK is the first candidate that is not identical to the Max_ACK.

The following shows exemplary Max_ACK and sub-Mac_ACK selections based on the operation of the dynamic ACK-list allocation generator 416.

If top 4 search result is 0, 0, 2, 1 then Max_ACK=0 and subMax_ACK=2

If top 4 search result is 1, 1, 1, 2 then Max_ACK=1 and subMax_ACK is not used

If top 4 search result is 1, 1, 2, 1 then Max_ACK=1 and subMax_ACK is not used

If top 4 search result is 1, 2, 0, 1 then Max_ACK=1 and subMax_ACK=2;

After this dynamic ACK selection, a range of [1, 2] ACK branches (e.g., 408) can be used, and in most situations only the most likely ACK candidate (Max_ACK) will be kept. This dramatically reduces the number of digital signal processing (DSP) cycles that are spent when compared with conventional systems that calculate all four branches for channel estimation and RM decoding.

Referring again to FIG. 4, the Max_ACK 418, and if necessary, the subMax_ACK 420 are input to a main branch and a dynamically allocated second branch, respectively, of a top-Q candidate CQI bits detector 408 having multiple branches and that is designed to generate the top-Q candidates of the CQI bits $[\tilde{a}_0, \ldots, \tilde{a}_{A-1}]_{(0:Q-1)}$ from only the pilot channel estimation 440. Each branch of the top-Q CQI detector 408 comprises a pilot channel estimation/CQI channel interpolation 422, CQI symbol channel compensation 424, a demodulator 426 and descrambler 428. Each branch of the top-Q CQI detector 408 also comprises an ACK symbol generator 430 and ACK channel estimator 432.

Each branch of the top-Q CQI detector 408 includes a TOP-Q RM (20, A) list decoder 434 that will produce the top Q most likely candidates for the CQI bits instead of only the best $\hat{a}_0, \ldots, \hat{a}_{A-1}$ based on an internal metric comparison within RM decoder 434. This is achievable by designing a RM decoder that can search the internal computation metrics for all possible entries of CQI information bits and then produce the top-Q most possible candidates.

A Q-list merger 436 receives the outputs from the list decoders 434 for one or both of the branches utilized. The Q-list merger 436 merges the outputs to generate the TOP-Q CQI candidates 442.

Figure 6:
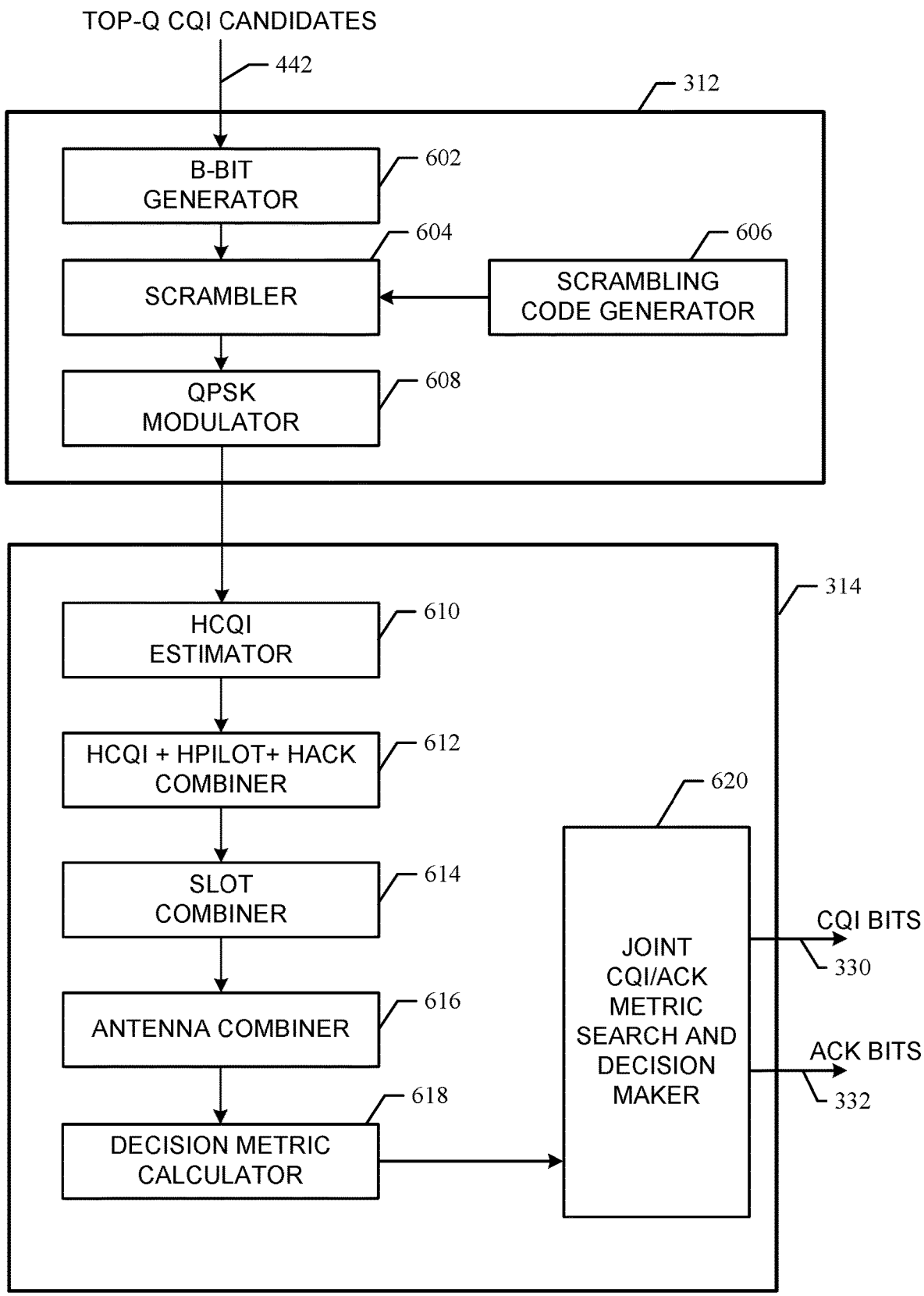
FIG. 6 shows exemplary embodiments of a TOP-Q candidate symbol generator and joint detector as shown in FIG. 3.

FIG. 6 shows exemplary embodiments of the TOP-Q candidate symbol generator 312 and the joint detector 314 shown in FIG. 3. The top-Q possible CQI candidates 442 are input to the top-Q CQI symbol generator 312, which comprises a B-bit generator 602 which can effectively generate the encoded bits $[\check{b}_0, \ldots, \check{b}_{19}]_{(0:Q-1)}$ quickly, followed by a scrambler 604 that uses a code generated by the scrambling code generator 606 to generate the scrambled top candidate CQI bits $[\tilde{b}(0), \ldots, \tilde{b}(19)]_{(0:Q-1)}$. These bits for each candidate will be passed to a QPSK modulator 608 to generate the top-Q CQI symbols $[\tilde{d}(0), \ldots, \tilde{d}(9)]_{(0:Q-1)}$.

In an exemplary embodiment, the B-bit generator 602 comprises an RM (20,A) encoder. In another embodiment, the B-bit generator 602 uses a look up table (LUT) implementation that use the a-bits $[\tilde{a}_0, \ldots, \tilde{a}_{A-1}]_{(0:Q-1)}$ as entry addresses to access pre-defined values of the b-bits. This alternative embodiment using a LUT can simplify the implementation complexity.

In an exemplary embodiment, all the top-Q CQI symbols are used to estimate an energy metric HCQI for the purpose of maximum-likelihood (ML) detection. This is done by the HCQI estimator 610 as shown by;

$$\text{Metric}_{(0:Q-1)}^{CQI,ns,(t,x)} = f(h_{ns,r}^{CQI}, d_{(0:Q-1)}).$$

where $h_{ns,r}^{CQI}$ is the CQI channel estimation vector for the r-th receive antenna for the ns-th slot within a subframe, $d_{(0:Q-1)}$ is the [0:Q−1]-th top-Q symbol candidate vector that is composed of the $[\tilde{d}(0), \ldots, \tilde{d}(9)]_{(0:Q-1)}$. The function $f(x)$ is a metric computation function that can be applied as an effective ML-decision metric for the Q candidate CQI bit sequences.

The metrics from pilot, ACK symbol candidates and the CQI candidates will be combined at combiner 612 to produce the metric within a slot and passed to the slot combiner 614 and antenna combiner 616 to generate the overall metric (by calculator 618) for the combined search space of [0:Q−1] CQI candidates and the [0:2^Nack−1] ACK candidates as $\text{Metric}_{[0:Q-1]}^{All,j}$.

A joint metric search and decision maker 620 will search a space of all the possible top-Q CQI candidates and all ACK bit candidates to determine the final detected CQI bits $\hat{a}_0, \ldots, \hat{a}_{A-1}$ 330 and $\{0/1/2\}$ ACK bits $\hat{b}(20), \ldots, \hat{b}(M_{bit}-1)$ 332 for Formats 2/2a/2b, respectively. Specifically, the final detected bit sequences are:

$$[\hat{a}_0, \ldots, \hat{a}_{A-1}, \hat{b}(20), \ldots, \hat{b}(M_{bit}-1)] = \underset{j,q}{\text{argmax}}(\text{Metric}_{q \in [0:Q-1]}^{All,j})$$

One example of the metric definition that can be effectively used as ML metric is shown as follows.

$$\text{Metric}_{(0:Q-1)}^{All,j} = \sum_r \sum_{n_s} \left[ (h_{pilot}^{n_s})^2 + |r_{Ack}^{n_s,r} \cdot (s_{Ack}^j)^*|^2 + \sum_{l=0}^{4} |r_{CQI}^{n_s,r}(l) \cdot (\tilde{d}(l \ \%5)_{0:Q-1})^*|^2 \right]$$

In another exemplary embodiment, a metric computation can be designed as the follows.

$$H_{(0:Q-1)}^{All,j} = r_{pilot}^{n_s} + r_{Ack}^{n_s,r} \cdot (s_{Ack}^j)^* + \sum_{l=0}^{4} r_{CQI}^{n_s,r}(l) \cdot (\tilde{d}(l \ \%5)_{0:Q-1})^*,$$

$$\text{Metric}_{(0:Q-1)}^{All,j} = \sum_r \sum_{n_s} H_{(0:Q-1)}^{All,j} (H_{(0:Q-1)}^{All,j})^*$$

Figure 7:
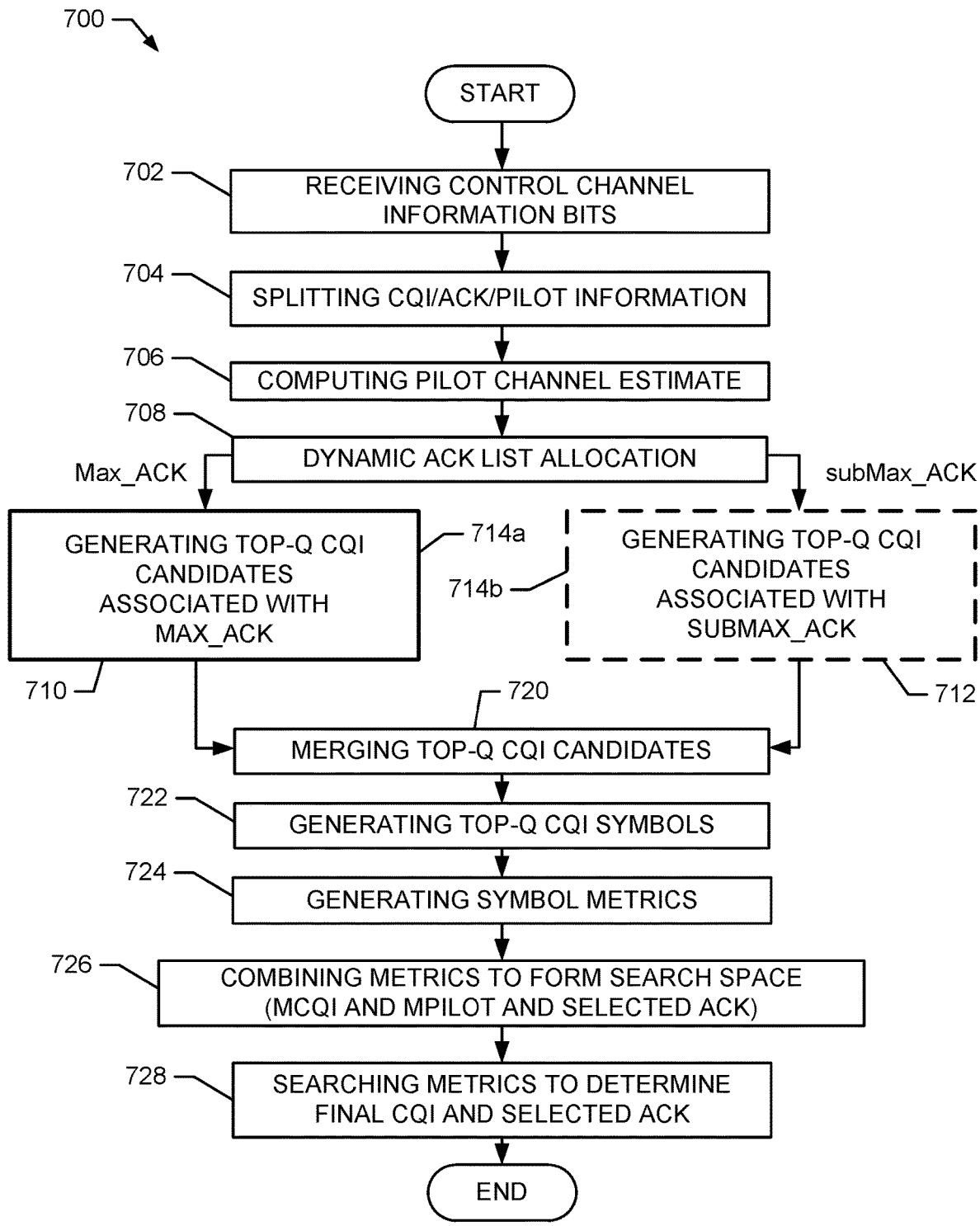
FIG. 7 shows an exemplary method for control channel detection.

FIG. 7 shows an exemplary method 700 for control channel detection. For example, the method 700 is suitable for use with the CCD 118 shown in FIGS. 1 and 3.

Block 702 comprises an operation of receiving control channel information bits. For example, control channel bits comprising CQI bits are received by the dynamic ACK-list allocation circuit 306 from the baseband front end 304.

Block 704 comprises an operation of splitting CQI/ACK/Pilot information from the received bits. For example, the splitter 412 performs this operation.

Block 706 comprises an operation of determining a pilot channel estimate. For example, the pilot channel estimate is determined by the pilot channel estimator 414.

Block 708 comprises an operation of dynamic ACK list allocation. For example, this operation is performed by the dynamic ACK list allocation generator 416. As a result of this operation, one or both of a Max_ACK and a subMax_ACK are generated.

Block 710 represents a main detection branch and block 712 represents a dynamically allocated second detection branch of the detector 408 shown in FIG. 4.

Blocks 714ab comprises operations of generating TOP-Q CQI candidates for the Max_ACK and subMax_ACK values. For example, the detection branches of the detector 408 shown in FIG. 4 generate the TOP-Q CQI candidates for the Max_ACK and subMax_ACK values. These values are input to the Q-list merger 436.

Block 720 comprises an operation of merging all TOP-Q CQI candidates. For example, the Q-list merger 436 performs this function to generate the merged list of TOP-Q CQI candidates 442.

Block 722 comprises an operation of generating Top-Q CQI symbols. For example, this operation is performed by the Top-Q CQI symbol generator 312.

Block 724 comprises an operation of generating symbol metrics. For example, this operation is performed by the estimator 610.

Block 726 comprises an operation of combining metrics to form a search space. For example, this operation is performed by the combiner 612. Additional operations are performed by the slot combiner 614 and the antenna combiner 616.

Block 728 comprises an operation of searching the search space to determine the transmitted CQI and ACK bits. For example, the operation is performed by the search and decision maker 620.

Thus, the method 700 operates to efficiently detect control bits received in an uplink PUCCH transmission. It should be note that the operation of the method 700 are exemplary and may be changed, modified, added to, delete from, and/or rearranged within the scope of the embodiments.

While particular embodiments of the present invention have been shown and described, it will be obvious to those skilled in the art that, based upon the teachings herein, changes and modifications may be made without departing from these exemplary embodiments and their broader aspects. Therefore, the appended claims are intended to encompass within their scope all such changes and modifications as are within the true spirit and scope of these exemplary embodiments of the present invention.

What is claimed is:

1. An apparatus, comprising:
   a dynamic acknowledgement (ACK) list allocation circuit that searches ACK candidates to generate a dynamic ACK list that includes two most likely ACK candidates;
   a top-Q candidate Channel Quality Indicator (CQI) bits detector that dynamically allocates a detection branch to each of the two most likely ACK candidates in the dynamic ACK list, and wherein the detection branches detect top-Q candidate CQI bits for the two most likely ACK candidates in the dynamic ACK list;
   a merger circuit that mergers the top-Q candidate CQI bits detected for the two most likely ACK candidates in the dynamic ACK list to generate a merged list;
   a top-Q CQI symbol generator that receives the merged list and generates top-Q CQI symbols for the top-Q candidate CQI bits detected for the two most likely ACK candidates in the dynamic ACK list; and
   a joint detector that receives the top-Q CQI symbols and detects transmitted CQI bits and ACK bits.

2. The apparatus of claim 1, wherein the two most likely ACK candidates comprises a first most likely ACK candidate called a Max_ACK candidate and a second most likely ACK candidate called a subMAX_ACK candidate.

3. The apparatus of claim 1, wherein the ACK candidates are received in a physical uplink control channel (PUCCH) in a telecommunication system and wherein the PUCCH includes one or both of CQI information bits and ACK information bits.

4. The apparatus of claim 1, wherein each detection branch comprises a Top-Q Reed-Muller (RM) decoder that searches internal computation metrics for all possible entries of CQI information bits to determine the top-Q candidate CQI bits.

5. The apparatus of claim 1, wherein the top-Q CQI symbol generator comprises:
   a B-bit generator that generates encoded bits from each of the Top-Q CQI candidates;
   a scrambler that scrambles the bits to generate scrambled bits; and
   a modulator that modulates the scrambled bits to generate the top-Q CQI symbols for the top-Q candidate CQI bits.

6. The apparatus of claim 1, wherein the joint detector comprises an energy metric estimator that uses the top-Q CQI symbols to estimate an energy metric (HCQI) for maximum-likelihood (ML) detection.

7. The apparatus of claim 6, wherein the joint detector comprises a combiner that combines metrics from pilot, ACK symbol candidates and CQI candidates to produce an energy metric within a slot.

8. The apparatus of claim 7, wherein the joint detector comprises a slot combiner that combines metrics from multiple slots.

9. The apparatus of claim 8, wherein the joint detector comprises an antenna combiner that combines metrics from multiple antennas to generate a search space of possible top-Q CQI candidates and ACK bit candidates.

10. The apparatus of claim 9, wherein the joint detector comprises a joint metric searcher that searches the search space to determine the transmitted CQI bits and ACK bits.

11. An apparatus comprising:
    a dynamic acknowledgement (ACK) list allocation circuit that searches ACK candidates to generate a dynamic ACK list that includes one or two most likely ACK candidates;
    a top-Q candidate Channel Quality Indicator (CQI) bits detector that dynamically allocates a detection branch to each of the one or two most likely ACK candidates in the dynamic ACK list, and wherein the detection branches detect top-Q candidate CQI bits for the one or two most likely ACK candidates in the dynamic ACK list;
    a merger circuit that mergers the top-Q candidate CQI bits detected for the one or two most likely ACK candidates in the dynamic ACK list to generate a merged list;
    a top-Q CQI symbol generator that receives the merged list and generates top-Q CQI symbols for the top-Q candidate CQI bits detected for the one or two most likely ACK candidates in the dynamic ACK list; and
    a joint detector that receives the top-Q CQI symbols and detects transmitted CQI bits and ACK bits,
    wherein the dynamic ACK list allocation circuit includes a channel estimator that uses ACK hypothesis symbols together with a selected data symbol and a pilot symbol to generate a symbol-level tree from which channel energy is determined; a metric calculator that calculates a channel energy metric from the channel energy; a searcher that search the channel energy metric to determine top four branches; and a decision circuit that selects the one or two most likely ACK candidates from the top four branches.

12. A method, comprising:
searching acknowledgement (ACK) candidates to generate a dynamic ACK list that includes two most likely ACK candidates;
dynamically allocating a detection branch to each of the two most likely ACK candidates in the dynamic ACK list, and wherein the detection branches detect top-Q candidate Channel Quality Indicator (CQI) bits for the two most likely ACK candidates in the dynamic ACK list;
merging the top-Q candidate CQI bits detected for the two most likely ACK candidates in the dynamic ACK list to generate a merged list;
generating top-Q CQI symbols for the top-Q candidate CQI bits detected for the two most likely ACK candidates in the dynamic ACK list; and
detecting transmitted CQI bits and ACK bits from metrics determined from the top-Q CQI symbols.

13. The method of claim 12, wherein the two most likely ACK candidates comprises a first most likely ACK candidate called a Max_ACK candidate and a second most likely ACK candidate called a subMAX_ACK candidate.

14. The method of claim 12, further comprising receiving the ACK candidates in a physical uplink control channel (PUCCH) in a telecommunication system and wherein the PUCCH includes one or both of CQI information bits and ACK information bits.

15. The method of claim 12, wherein each detection branch performs an operation of searching internal computation metrics of a Top-Q Reed-Muller (RM) decoder for all possible entries of CQI information bits to determine the top-Q candidate CQI bits.

16. The method of claim 12, wherein the operation of generating the top-Q CQI symbol comprises:
generating encoded bits from each of the Top-Q CQI candidates;
scrambling the bits to generate scrambled bits; and
modulating the scrambled bits to generate the top-Q CQI symbols for the top-Q candidate CQI bits.

17. The method of claim 12, wherein the operation of detecting comprises estimating an energy metric (HCQI) based on the top-Q CQI symbols.

18. The method of claim 17, wherein the operation of detecting comprises:
combining metrics from pilot, ACK symbol candidates and CQI candidates to produce an energy metric within a slot;
combining metrics from multiple slots; and
combining metrics from multiple antennas to generate a search space of possible top-Q CQI candidates and ACK bit candidates.

19. The method of claim 18, wherein the operation of detecting comprises searching the search space to determine the transmitted CQI bits and ACK bits.

20. A method, comprising:
searching acknowledgement (ACK) candidates to generate a dynamic ACK list that includes one or two most likely ACK candidates;
dynamically allocating a detection branch to each of the one or two most likely ACK candidates in the dynamic ACK list, and wherein the detection branches detect top-Q candidate Channel Quality Indicator (CQI) bits for the one or two most likely ACK candidates in the dynamic ACK list;
merging the top-Q candidate CQI bits detected for the one or two most likely ACK candidates in the dynamic ACK list to generate a merged list;
generating top-Q CQI symbols for the top-Q candidate CQI bits detected for the one or two most likely ACK candidates in the dynamic ACK list; and
detecting transmitted CQI bits and ACK bits from metrics determined from the top-Q CQI symbols, wherein the searching further includes generating a symbol-level tree from which channel energy is determined, wherein the symbol-level tree is generated from ACK hypothesis symbols together with a selected data symbol and a pilot symbol; calculating a channel energy metric from the channel energy; searching the channel energy metric to determine top four branches; and selecting the one or two most likely ACK candidates from the top four branches.

* * * * *